(12) United States Patent
Forrest et al.

(10) Patent No.: US 10,032,812 B2
(45) Date of Patent: Jul. 24, 2018

(54) FABRICATION OF PHOTODIODE ARRAY ON SPHERICAL PLATFORM FOR 4-PI DETECTION AWARENESS

(71) Applicant: THE REGENTS OF THE UNIVERSITY OF MICHIGAN, Ann Arbor, MI (US)

(72) Inventors: Stephen R. Forrest, Ann Arbor, MI (US); Kyusang Lee, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 22 days.

(21) Appl. No.: 15/399,865

(22) Filed: Jan. 6, 2017

(65) Prior Publication Data

US 2018/0114803 A1 Apr. 26, 2018

Related U.S. Application Data

(60) Provisional application No. 62/275,266, filed on Jan. 6, 2016.

(51) Int. Cl.
| | | |
|---|---|---|
| *H01L 21/00* | (2006.01) | |
| *H01L 27/146* | (2006.01) | |
| *H01L 31/18* | (2006.01) | |
| *H01L 31/0392* | (2006.01) | |

(52) U.S. Cl.
CPC .... *H01L 27/14605* (2013.01); *H01L 27/1462* (2013.01); *H01L 27/14632* (2013.01); *H01L 27/14636* (2013.01); *H01L 27/14643* (2013.01); *H01L 27/14685* (2013.01); *H01L 27/14687* (2013.01); *H01L 27/14692* (2013.01); *H01L 27/14694* (2013.01); *H01L 31/03926* (2013.01); *H01L 31/1896* (2013.01)

(58) Field of Classification Search
CPC ......... H01L 27/14605; H01L 27/1462; H01L 27/14632; H01L 27/14636; H01L 27/14643; H01L 27/14685; H01L 27/14687; H01L 27/14692; H01L 27/14694; H01L 31/03926
USPC ........................................... 438/70
See application file for complete search history.

(56) References Cited

U.S. PATENT DOCUMENTS

| | | | |
|---|---|---|---|
| 8,372,726 B2 | 2/2013 | de Graff et al. | |
| 8,742,325 B1 | 6/2014 | Droz et al. | |
| 9,065,010 B2 | 6/2015 | Forrest et al. | |
| 2003/0019668 A1* | 1/2003 | Reade | C30B 23/02 177/84 |

(Continued)

FOREIGN PATENT DOCUMENTS

| | | |
|---|---|---|
| WO | WO-2012097163 A1 | 7/2012 |
| WO | WO-2015084868 A1 | 6/2015 |

*Primary Examiner* — Brook Kebede
(74) *Attorney, Agent, or Firm* — Harness, Dickey & Pierce, P.L.C.

(57) ABSTRACT

A method is presented for fabricating an array of sensors on an object having a non-developable surface. The method includes: growing an epitaxial structure on a substrate; bonding, without the use of an adhesive, the epitaxial structure to a flexible membrane to form a device structure; forming an array of sensors from the epitaxial structure of the device structure using photolithographic techniques; cutting the device structure into segments; and bonding the segments onto the target object.

15 Claims, 6 Drawing Sheets

(56) References Cited

U.S. PATENT DOCUMENTS

2003/0119220 A1* 6/2003 Mlcak ............... B81B 3/0089
                                                    438/52

* cited by examiner

FABRICATION OF PHOTODIODE ARRAY ON SPHERICAL PLATFORM FOR 4-PI DETECTION AWARENESS

CROSS-REFERENCE TO RELATED APPLICATIONS

This application claims the benefit of U.S. Provisional Application No. 62/275,266, filed on Jan. 6, 2016. The entire disclosure of the above application is incorporated herein by reference.

GOVERNMENT CLAUSE

This invention was made with government support under W911NF-08-02-0004 and W911NF-13-1-0485 awarded by the U.S. Army/ARO. The Government has certain rights in this invention.

FIELD

The present disclosure relates to method for fabricating an array of sensors on an object having a non-developable surface.

BACKGROUND

Vision is one of the most crucial senses for humans when evaluating a scene. Typical cameras on planar platform have a field-of-view of 50°×40°, and the hemispherical focal plane array (HFPA) of detector can extend a field-of-view to 140°×140°. However, the field-of-view is still limited to the direction forward of the detector array even when the HFPA is employed. This disclosure demonstrates a 4-π detection by employing a detector array on a spherical platform which can cover near complete vision in all direction. An epitaxial lift-off (ELO) process, or wafer etch removal techniques can be combined with cold-weld bonding or Van der Waals bonding based transfer process to transplant the detector array onto a thin and flexible platform. Then, the transferred array is wrapped onto target objects with the minimum stress using origami process. This process can be employed to create a detector array in any kind of arbitrary three dimensional structure including sphere, hemisphere and cylindrical platform. Furthermore, this method improves the pixel density by eliminating the stretching process which is conventionally employed to expand a two-dimensional structure into a three-dimensional structure.

This section provides background information related to the present disclosure which is not necessarily prior art.

SUMMARY

This section provides a general summary of the disclosure, and is not a comprehensive disclosure of its full scope or all of its features.

In one aspect, a method is provided for fabricating an array of sensors on an object having a non-developable surface. The method includes: growing an epitaxial structure on a substrate; bonding, without the use of an adhesive, the epitaxial structure to a flexible membrane to form a device structure; forming an array of sensors from the epitaxial structure of the device structure using photolithographic techniques; cutting the device structure into segments, where shape of the segments depends on shape of the non-developable surface of a target object; and bonding the segments onto the target object.

Prior to the step of bonding the epitaxial structure to a flexible membrane, gold or another noble metal may be deposited onto the epitaxial structure and the flexible membrane. Bonding the segments onto the target object may include depositing water onto the non-developable surface of the target object, placing the segments over the non-developable surface of the target object, and baking the target object, thereby bonding the segments on the non-developable surface of the target object In one embodiment, the array of sensors may be formed by selectively etching the sacrificial layer of the epitaxial structure to expose the active device region; patterning the active device region to form individual sensors in the array of sensors; further patterning the active device region to form interconnects between the individual sensors in the array of sensors; and optionally coating the array of sensors with an anti-reflection layer.

In an example embodiment, the target object is defined as a sphere and the device structure is cut into segments having the shape of vesical piscis.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
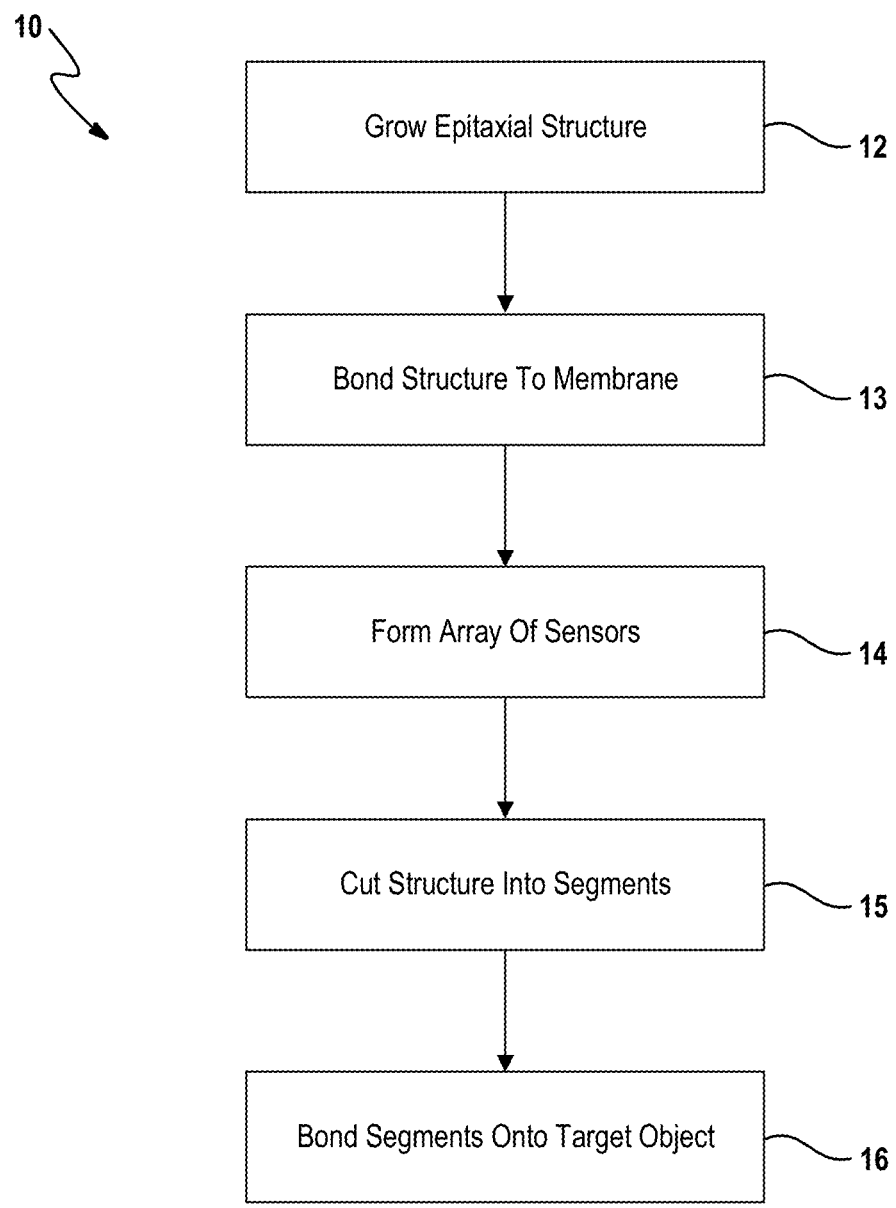
FIG. 1 is a flowchart depicting a method of fabricating an array of sensors of an object.

FIG. 1 is a method for fabricating an array of sensors on an object. The process involves an epitaxial lift-off (ELO) process that allows for transplantation of a preprocessed photodetector or another type of active device structure onto a thin and flexible substrate. In contrast to conventional thermoformation or stretching process to make 2D structure into 3D structure, this method employs origami wrapping process to cover a sphere or other objects with an active device structure. This approach allows for simplified attachment of flexible devices on conformal or pre-deformed substrate surfaces. While reference is made herein to a sphere, other types of target objects having a developable or a non-developable surface fall within the scope of this disclosure.

To begin fabrication, an epitaxial structure is grown onto a substrate as indicated at 12. The growth process which enables lift-off of the active device region 21 from a wafer is shown in FIG. 2A. The epitaxial structure 20 includes sequential growth of a sacrificial layer 22 and an active device region 21. In an example embodiment, the wafer 23 is comprised of indium phosphide (InP). A sacrificial release layer 22 is grown onto the wafer 23. If wafer recycling is desired, protection/buffer layers (not shown) may be deposited onto the wafer 23 before the growth of the sacrificial release layer 22. Example materials for the protection/buffer layer may be but is not limited to indium phosphide or indium gallium arsenide (InGaAs). In this case, the sacrificial release layer is grown onto the protection/buffer layer. The active device region 21 is finally grown onto the sacrificial release layer 22. The active device region 21 is preferably grown in an inverted order such that after bonding to the secondary substrate, devices can be fabricated in their conventional orientation, thereby eliminating a second transfer step often employed in ELO device processing. In the example described above, the active device region is comprised of indium gallium arsenide (InGaAs) and the sacrificial layer is comprised of aluminum arsenide (AlAs). These materials are merely illustrative. It is readily understood that other types of materials may be used to grow an epitaxial structure.

In conventional epitaxial lift-off, lifted-off layers are typically attached to flexible secondary handles using adhesives such as thermal releasing tape, wax, or glue. These adhesives can be bulky, heavy, brittle, and subject to degradation while also requiring an additional transfer following the separation of the epitaxy onto an intermediate "handle". To eliminate all use of adhesives and the necessity of an intermediate handle transfer, one can attach the epitaxial structure directly to the final flexible substrate by bonding the epitaxial structure to a flexible membrane to form a device structure as indicated at 13. In the example embodiment, the flexible membrane is a polyethylene terephthalate glycol-modified sheet. A thermally-assisted cold-weld bond is used to thereby apply pressure across the two surfaces to be bonded. To make the bond, the surfaces may be pre-coated with layers of a similar noble metal such as gold (Au). Gold is insensitive to oxidation that can increase the pressure needed to effectively cold-weld bond the surfaces. Other techniques for bonding the epitaxial structure to a flexible membrane without the use of an adhesive are also contemplated by this disclosure.

Once the epitaxial structure is bonded to the plastic substrate, the active device region is lifted-off or separated from the parent wafer, for example by immersion in diluted hydrogen fluoride (HF). The separated epitaxial structure is then fabricated into photodiodes as further described below.

After the epitaxial lift-off process, the protection layers can be chemically removed, and the cleaned parent wafer can be re-loaded into the molecular beam epitaxy (MBE) or metalorganic chemical vapour deposition (MOCVD) chamber for subsequent growth. In this way, the same procedure can be repeated multiple times with photodiodes or other sensors fabricated after each growth/ELO/cleaning cycle to ensure that no degradation of the original wafers was carried into the next cycle.

Figure 2B:
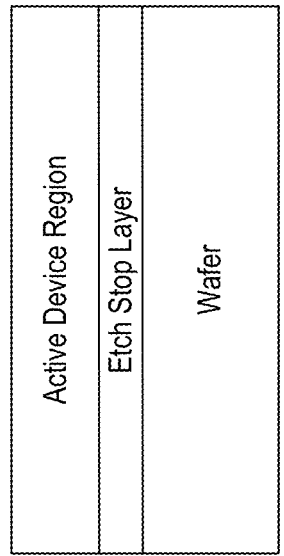
FIGS. 2A and 2B are schematics of the generalized wafer structure for epitaxial lift-off (ND-ELO) and wafer etch removal process, respectively. The active region structure is varied according to the application requirements.
Figure 2A:
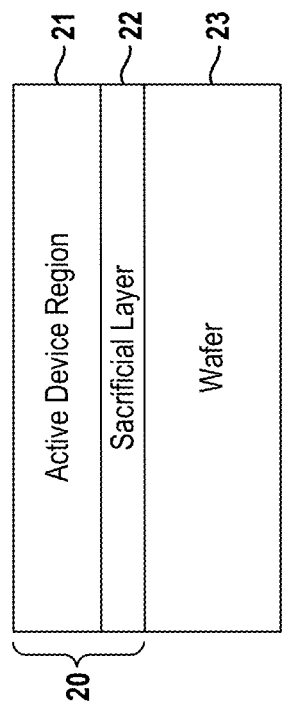

Instead of lifting-off the entire active device layer 21, the device can be fabricated first on the wafer and then the fabricated device can be lifted-off as seen in FIG. 2B. In this alternative approach, the additional transferring process is required since normal growth order should be employed instead of the inverted order used to fabricate the device on the wafer in FIG. 2A. The fabricated device can be transferred to the flexible substrate via transfer printing method, for example using tethered PR and PDMS stamp or using black wax. The full wafer removal method (i.e., using an etch stop layer) also can be employed to create the thin-film layer on the flexible substrate by bonding the wafer onto it and then etching the whole wafer.

Returning to FIG. 1, an array of sensors is formed at 14 from the epitaxial structure using photolithographic techniques. In an example embodiment, the sacrificial layer of the epitaxial structure is selectively etched to expose the active device region. The exposed active device region is then patterned to form individual sensors within the array of sensors. The active device region is further patterned to form interconnects between the individual sensors in the array of sensors. Lastly, the array of sensors may optionally be coated with an anti-reflection layer, such as magnesium fluoride or zinc sulfide. Again, this method is merely illustrative and other techniques for forming the array of sensors from the epitaxial structure are contemplated by this disclosure.

Figure 3B:
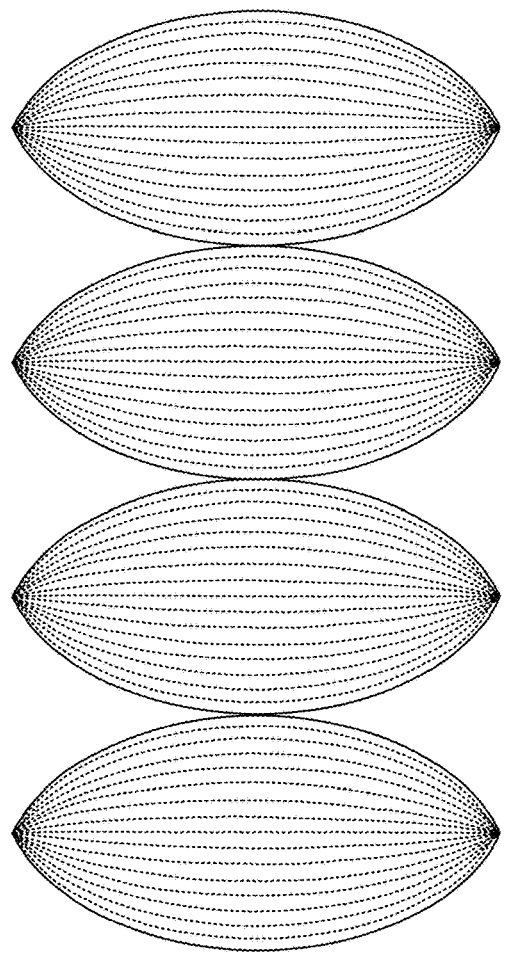
FIGS. 3A and 3B are examples of planar figures for the detector array with petal and comb shaped segments, respectively.
Figure 3A:
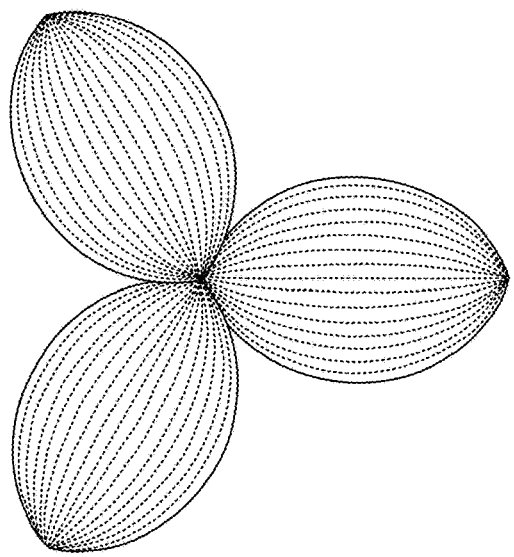

Once the array of sensors has been fabricated on the thin-film substrate, the substrate is shaped into a planar figure of the target object (e.g., sphere). In an example embodiment, the substrate is cut into different segments as indicated at 15, for example using dicing or lithography. FIGS. 3A and 3B show examples for a planar figure of sphere, where each line represents a detector array. In these examples, the segments have the shape of vesical piscis. In another example, the segments for a sphere may have other shapes corresponding to an interrupted or polyhedral equal-area projection of a sphere. Designs for the planar figures can be done, for example using the surface flattening function of finite element of 3D surface.

Shapes for the segments depend upon the shape of the target object. Examples of other objects having non-developable surface include but are not limited to a hemisphere and a toroid. In the case of a hemisphere, segments with shapes similar to the sphere may be used. Moreover, the method presented herein is also applicable to target objects having developable surfaces, such as a cylinder. In the case of a cylinder, the substrate may be cut into segments having the shape of a rectangle. These examples are merely illustrative. Once skilled in the art will readily understand that this method may be adapted for different target objects.

Figure 4:
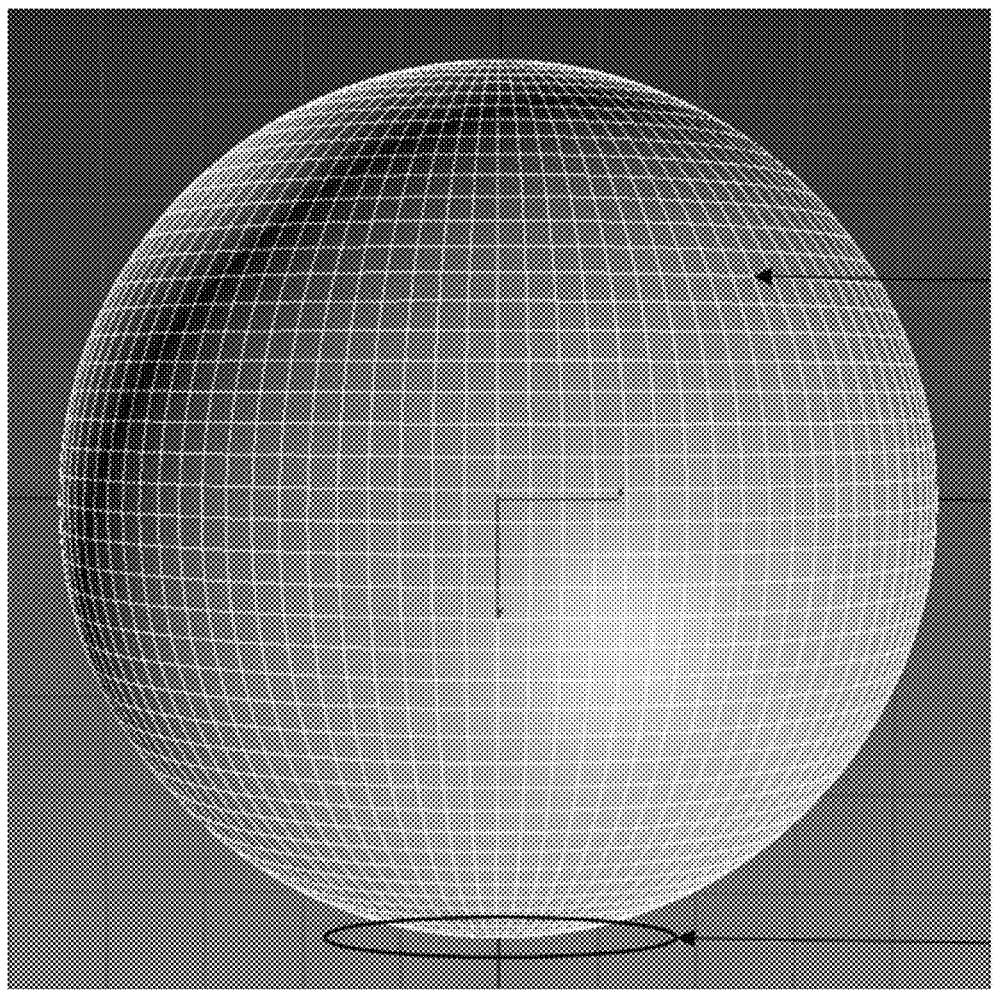
FIG. 4 is a schematic of photodetector array wrapped onto a sphere.

Once the planar figure of sphere is prepared, it is wrapped onto the glass or plastic sphere platform. In the example embodiment, the cut segments are bonded at 16 onto the target object. To bond the thin-film onto the sphere platform, Van der Waals bonding can be employed by using water droplet between the thin-film and sphere platform which provide the surface tension. The post-bake of sample can secure the bonding. The identical fabrication method to form a spherical detector array can be employed for the fabrication of GaAs, InGaAs and any kind of thin-film type photodiode, and active/passive matrix of it. The completed construct of the photodiode array on a spherical platform is shown in FIG. 4. It is understood that a contact pad can be placed on the top or bottom of the sphere.

Figure 5B:
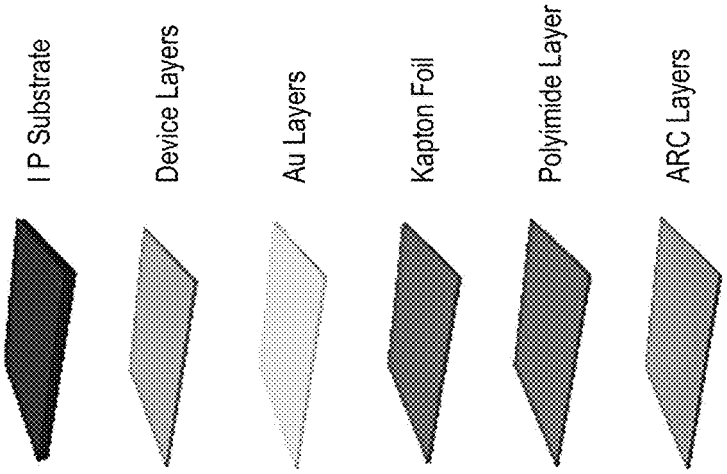
FIGS. 5A-5D are schematics depicting the fabrication of thin-film pin photodiode on a flexible kapton substrate.
Figure 5B:
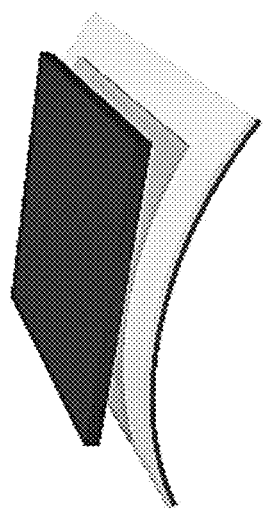
Figure 5D:
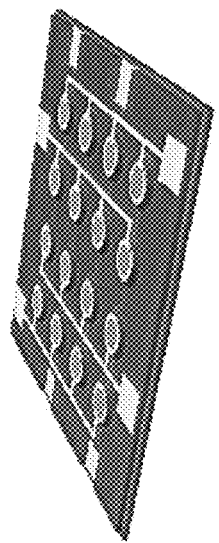

As a proof of concept, the fabrication of a thin-film photodiode on a flexible kapton substrate is described in relation to FIGS. 5A-5D. First, a linearly connected 10×10 pin thin-film InGaAs photodiode matrix with 20 μm opening diameters was transferred to a silicon (Si) substrate as seen in FIG. 6. Fabrication procedure for the photodiode matrix is as follows. An epitaxial structure is grown on a 2" InP substrate wafer using gas source molecular beam epitaxy (GSMBE). The epi-wafer and undoped silicon are diced into appropriate sizes for the 10×10 pin photodiode arrays with 100 μm device diameters. For a 10×10 array, the epi-wafer is diced into 4 mm×4 mm squares, and the Si wafer is diced into 15 mm×15 mm squares. In this example, 300 nm thick Au is deposited onto the epi-structure sample back surfaces, and 5 nm Ir/300 nm Au is deposited on the silicon substrates.

Figure 5A:
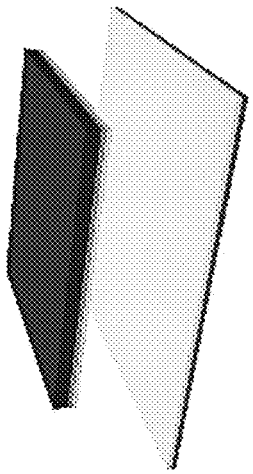
Figure 6:
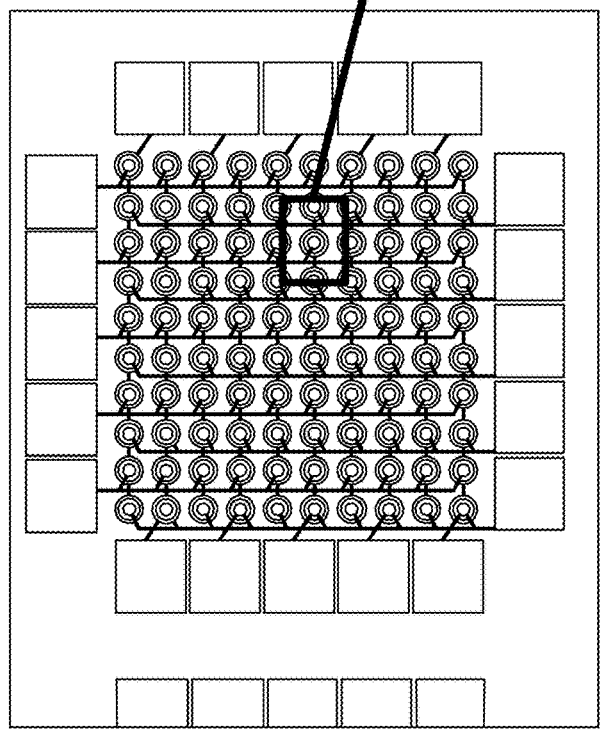
FIG. 6 is a photographic image of linearly connected 10×10 pin thin-film InGaAs photodiode matrix fabricated on flexible Kapton substrate.

The epi-sample and the silicon sample are then cold weld bonded without adhesives using an EVG510 wafer bonder as seen in FIG. 5A.

Figure 5C:
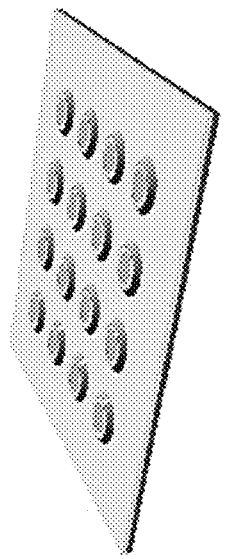
Figure 7:
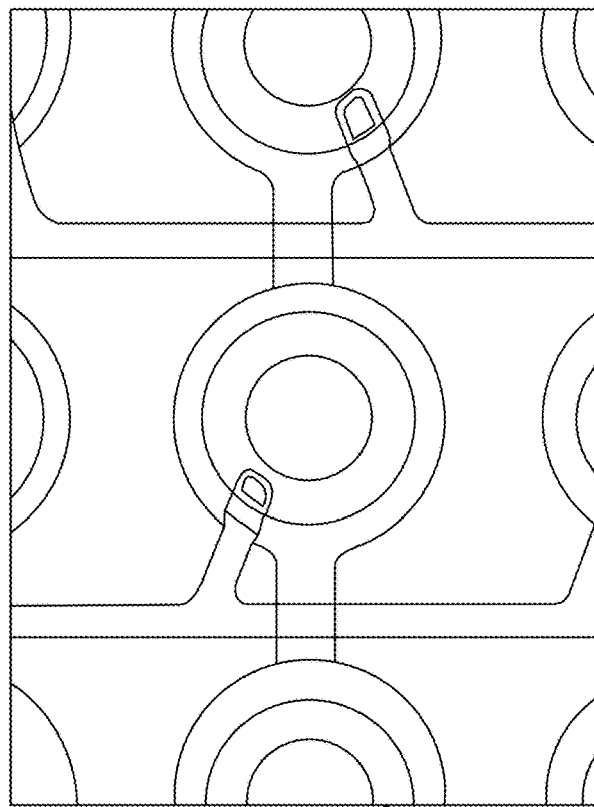
FIG. 7 is a microscopic image of the linearly connected 10×10 pin thin-film InGaAs photodiode matrix fabricated on flexible Kapton substrate.

Referring to FIG. 5B, the pin photodiode layer is epitaxially lifted off from the InP substrate by selectively etching the AlAs sacrificial layer using 10% HF, thereby leaving a top illuminated pin photodiode array bonded on silicon. In FIG. 5C, the front side ring contacts are patterned to define the device area. 10×10 mesa arrays with opening diameters of 20 μm are defined using plasma and wet-etching. Back side linear contact is patterned by wet-etching to form horizontally connected linear mesa arrays as seen in FIG. 5D. A 1 μm thick polyimide (PI2610) insulating layer is spin-coated for passivation. Front side linear contact is patterned by lift-off to form vertically connected linear mesa arrays. Double layer MgF2/TiO2 anti-reflection coating (ARC) is deposited to finish the fabrication.

For the demonstrated device, the dark current and external quantum efficiency (EQE) of an individual photodiode is measured under both dark and 60 μW 1550 nm laser illuminating conditions. The dark current at −1 V bias is 37 nA (current density of 2.9 mA/cm2) and the EQE is 65%. A performance comparison between 20 μm opening diameter linearly connected matrix and the previously demonstrated 100 μm opening diameter linearly connected array is shown in the table below

| @-1 V bias | 20 um Diameter | 100 um Diameter |
|---|---|---|
| Dark Current | 37 nA | 5 nA |
| Current Density | 2.9 mA/cm$^2$ | 24 μA/cm$^2$ |
| EQE@1550 nm | 65% | 64% |

The device fabrication yield is 100% on this 10×10 photodiode matrix.

Furthermore, a linearly connected 10×10 pin thin-film InGaAs photodiode matrix with 20 μm and 100 μm opening diameters were also fabricated and transferred to a flexible Kapton substrate or a polyethylene terephthalate glycol-modified sheet. The fabrication procedures are almost identical as those for transfer to a silicon substrate.

For this variant, dark current and EQE of an individual single photodiode was also measured under both dark and 60 μW 1550 nm laser illuminating conditions. The dark current at −1 V bias is measured to be 4 nA (current density of 20 μA/cm2) on 100 μm opening diameter devices, and 15 nA (current density of 1.2 mA/cm2) on 20 μm opening diameter devices. The EQE is measured to be 74%, which matches the calculated EQE for devices with 0.85 μm InGaAs active layer thicknesses. A performance comparison between 10×10 linearly connected array fabricated on Kapton and on a Si substrate with both 20 μm and 100 μm device diameters is shown in the table below

| 100 um device diameter | | | 20 um device diameter | | |
|---|---|---|---|---|---|
| @-1 V bias | Si | Kapton | @-1 V bias | Si | Kapton |
| Dark Current | 5 nA | 4 nA | Dark Current | 37 nA | 15 nA |
| Dark Current Density | 25 uA/cm2 | 20 uA/cm2 | Dark Current Density | 2.9 mA/cm2 | 1.2 mA/cm2 |
| EQE @ 1550 nm | 1.6 um InGaAs 86% | 0.85 um InGaAs 74% | EQE@ 1550 nm | 0.75 um InGaAs 65% | 0.85 um InGaAs — |
| Yield | 99% | — | Yield | 100% | — |

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A method for fabricating an array of sensors on an object having a non-developable surface, comprising:
    growing an epitaxial structure on a substrate;
    bonding, without the use of an adhesive, the epitaxial structure to a flexible membrane to form a device structure;
    forming, from the epitaxial structure of the device structure, an array of sensors using photolithographic techniques;
    cutting the device structure into segments, where shape of the segments depends on shape of the non-developable surface of a target object;
    bonding the segments onto the target object.

2. The method of claim 1 wherein the flexible membrane is further defined as a polyethylene terephthalate glycol-modified sheet.

3. The method of claim 1 wherein growing an epitaxial structure on a substrate further comprises:
    growing sacrificial layer onto a semiconductor wafer; and
    growing an active device region in an inverted order onto the sacrificial layer.

4. The method of claim 3 wherein forming the array of sensors further comprises:
    selectively etching the sacrificial layer of the epitaxial structure to expose the active device region;
    patterning the active device region to form individual sensors in the array of sensors;
    further patterning the active device region to form interconnects between the individual sensors in the array of sensors; and
    coating the array of sensors with an anti-reflection layer.

5. The method of claim 1 further comprises depositing gold onto the epitaxial structure and the flexible membrane prior to the step of bonding the epitaxial structure to a flexible membrane.

6. The method of claim 1 wherein the sensors in the array of sensors are further defined as photodiodes.

7. The method of claim 1 further comprises cutting the device structure into segments having shape of vesical piscis, wherein the target object is further defined as a sphere.

8. The method of claim 7 wherein bonding the segments onto the target object further comprises depositing water onto the non-developable surface of the target object, placing the segments over the non-developable surface of the target object, and baking the target object, thereby bonding the segments on the non-developable surface of the target object.

9. The method of claim 8 further comprises depositing anti-reflective coating onto the segments after the step of bonding the segments onto the target object.

10. A method for fabricating an array of sensors onto a sphere, comprising:
    growing an epitaxial structure on a substrate;
    bonding the epitaxial structure onto a flexible membrane to form a device structure;
    forming, from the epitaxial structure of the device structure, an array of sensors using photolithographic techniques;
    cutting the device structure into segments, each segment having shape of vesical piscis; and
    bonding the segments onto a sphere.

11. The method of claim 10 wherein the flexible membrane is further defined as a polyethylene terephthalate glycol-modified sheet.

12. The method of claim 11 wherein growing an epitaxial structure on a substrate further comprises:
    growing sacrificial layer onto a semiconductor wafer; and
    growing an active device region in an inverted order onto the sacrificial layer.

13. The method of claim 12 wherein forming the array of sensors further comprises:
    selectively etching the sacrificial layer of the epitaxial structure to expose the active device region;
    patterning the active device region to form individual sensors in the array of sensors;
    further patterning the active device region to form interconnects between the individual sensors in the array of sensors; and
    coating the array of sensors with an anti-reflection layer.

14. The method of claim 13 further comprises depositing gold onto the epitaxial structure and the flexible membrane prior to the step of bonding the epitaxial structure to a flexible membrane.

15. A method for fabricating an array of sensors on an object having a non-developable surface, comprising:
    growing sacrificial layer onto a semiconductor wafer; and
    growing an active device region in an inverted order onto the sacrificial layer to form an epitaxial structure;
    bonding, without the use of an adhesive, the epitaxial structure to a flexible membrane to form a device structure;
    selectively etching the sacrificial layer of the epitaxial structure to expose the active device region;
    patterning the active device region to form individual sensors in an array of sensors;

further patterning the active device region to form interconnects between the individual sensors in the array of sensors;
cutting the active device region into segments; and
bonding the segments onto the target object.

* * * * *